US008621744B2

(12) United States Patent
Aleksov et al.

(10) Patent No.: US 8,621,744 B2
(45) Date of Patent: Jan. 7, 2014

(54) METHOD OF MANUFACTURING AN INDUCTOR FOR A MICROELECTRONIC DEVICE

(75) Inventors: Aleksandar Aleksov, Chandler, AZ (US); Gloria Alejandra Camacho-Bragado, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 84 days.

(21) Appl. No.: 13/215,458

(22) Filed: Aug. 23, 2011

(65) Prior Publication Data

US 2011/0302771 A1     Dec. 15, 2011

Related U.S. Application Data

(62) Division of application No. 12/157,803, filed on Jun. 11, 2008, now abandoned.

(51) Int. Cl.
*H01F 7/06* (2006.01)
(52) U.S. Cl.
USPC ............... 29/605; 29/606; 29/607; 205/119; 205/122; 216/62; 216/65; 216/66; 336/178; 336/200; 336/212; 336/221; 336/223
(58) Field of Classification Search
USPC ......... 29/602.1, 605–607, 829, 832; 205/119, 205/122; 216/62, 65, 66; 336/178, 200, 336/212, 221, 223, 225, 229, 232, 233
See application file for complete search history.

(56) References Cited

U.S. PATENT DOCUMENTS

| | | | |
|---|---|---|---|
| 4,847,986 A | 7/1989 | Meinel | |
| 5,191,699 A | 3/1993 | Ganslmeier et al. | |
| 5,871,662 A | 2/1999 | Van Der Zaag et al. | |
| 5,884,990 A | 3/1999 | Burghartz et al. | |
| 5,959,846 A | 9/1999 | Noguchi et al. | |
| 6,249,039 B1* | 6/2001 | Harvey et al. | 257/531 |
| 6,292,084 B1* | 9/2001 | Choi et al. | 336/200 |
| 6,429,764 B1 | 8/2002 | Karam et al. | |
| 6,661,328 B2 | 12/2003 | Kato et al. | |
| 6,870,456 B2* | 3/2005 | Gardner | 336/200 |
| 7,196,607 B2* | 3/2007 | Pleskach et al. | 336/200 |
| 7,388,462 B2 | 6/2008 | Ahn et al. | |
| 8,174,348 B2* | 5/2012 | Ikriannikov | 336/192 |
| 2003/0005569 A1 | 1/2003 | Hiatt et al. | |

(Continued)

OTHER PUBLICATIONS

"Nano-particle Technology", URL;http://www.ulvac-materials.co.jp/english/seihin/05nanoindex.html, 1 Page, 2006.

(Continued)

*Primary Examiner* — Paul D Kim
(74) *Attorney, Agent, or Firm* — Winkle, PLLC

(57) ABSTRACT

A method of manufacturing an inductor for a microelectronic device comprises providing a substrate (610), forming a first plurality of inductor windings (111, 211, 411, 620, 2030) over the substrate, forming a magnetic inductor core (112, 212, 412, 810) over the first plurality of inductor windings, and forming a second plurality of inductor windings (113, 213, 413, 1010) over the magnetic inductor core. In another embodiment, the method comprises forming the inductor on a sacrificial substrate (1610) such that the inductor can subsequently be mounted onto a carrier tape (1810). In yet another embodiment, a method of manufacturing a substrate for a microelectronic device comprises forming an inductor within a build-up layer (101, 102, 103, 104) of a substrate.

10 Claims, 10 Drawing Sheets

(56) References Cited

U.S. PATENT DOCUMENTS

| | | |
|---|---|---|
| 2003/0070282 A1 | 4/2003 | Hiatt et al. |
| 2005/0093669 A1 | 5/2005 | Ahn et al. |
| 2008/0252407 A1 | 10/2008 | Anderson |
| 2009/0188104 A1 | 7/2009 | Ching et al. |

OTHER PUBLICATIONS

"Development of Technology for Forming Fine Line Circuits Using Nano Metal Ink", Newsletter "SEI News" vol. 335, Aug. 2005, 2 Pages.

Ramanathan S. et ai.,"Eiectrical properties of thin film zirconia grown by ultraviolet ozone oxidation", Journal of Applied Physics, vol. 91, No. 7, Apr. 1, 2002, pp. 4521-4527.

"Materials/Targets", URL: http://www.ulvac.com/materials_targets/nano.asp , 1 Page, 2006.

Scheer, Hella-C., et al., "Handbook of Thin Film Materials: vol. 5, Nanomaterials and Magnetic Thin Films", Edited by Hari Singh Nalwa, Chapter 1—'Nanoimprint Techniques', pp. 1-60, 2006.

Hauser, Hans, et al., "Handbook of Thin Film Materials: vol. 5, Nanomaterials and Magnetic Thin Films", Edited by Hari Singh Nalwa, Chapter 8—'Thin Magnetic Films', pp. 375-437., 2006.

Morrison S. et al.,"Magnetic and Structural Properties of Nickel zinc Ferrite Nanoparticles synthesized at room temperature",Journal of Applied Physics, vol. 95, No. 11, Dated Jun. 1, 2004, pp. 6392-6395.

Abidine et al., "CMOS—Compatible Micromachined Toroid and Solenoid Inductors With High Q-Factors", IEEE Electron Device Letters, vol. 28, No. 3, Mar. 2007, pp. 226-228.

Okada et al., "Development of Fine Circuit Pattern Formation Process Using Nano-Metal Ink", SEI Technical Review, No. 62, Jun. 2006, pp. 54-57.

Simonite T., "Modified ink printer churns out electronic circuits" Dated Apr. 18, 2007, 2 Pages.

\* cited by examiner

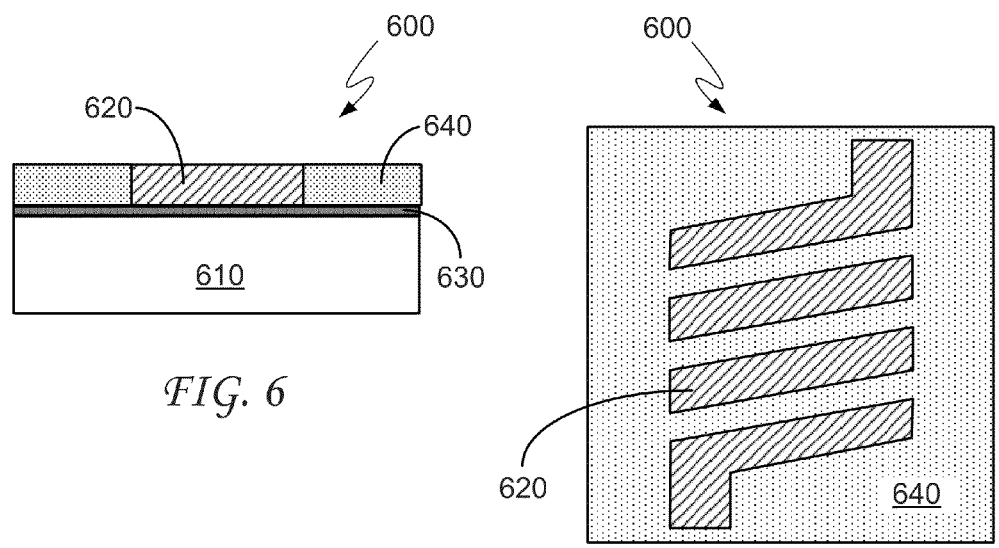
FIG. 6
FIG. 7
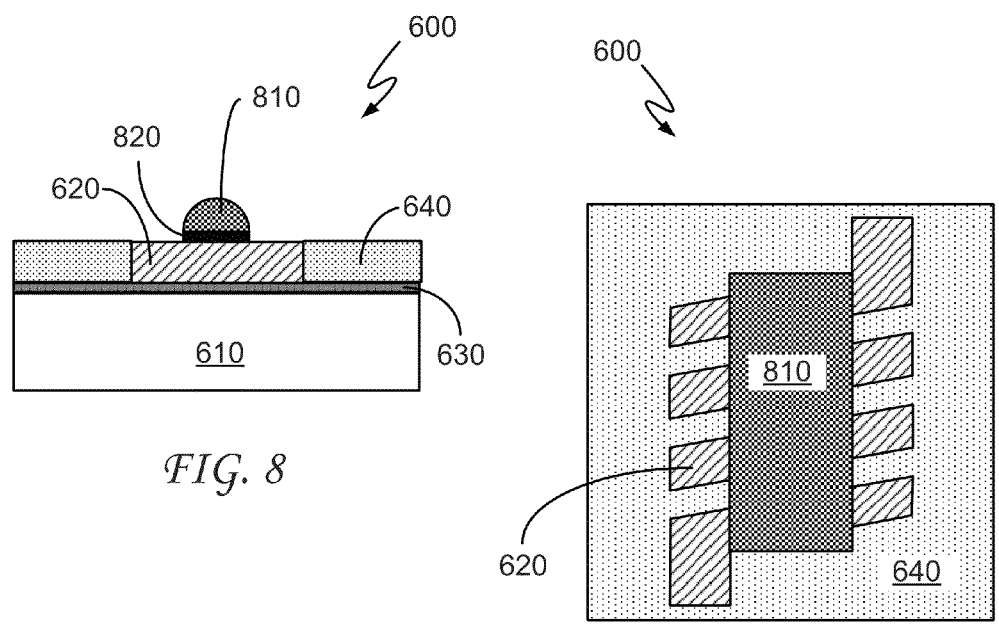
FIG. 8
FIG. 9

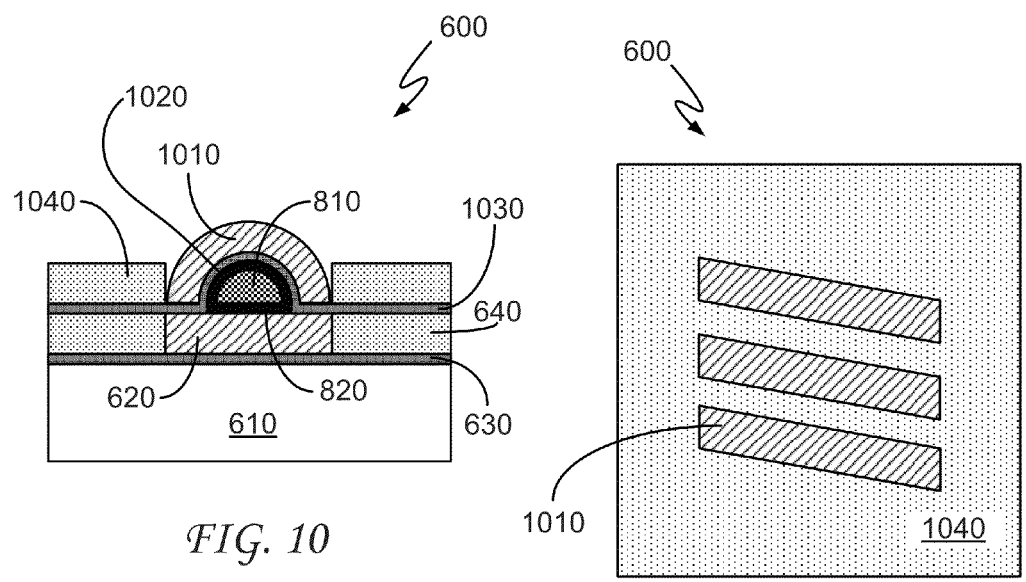
FIG. 10
FIG. 11
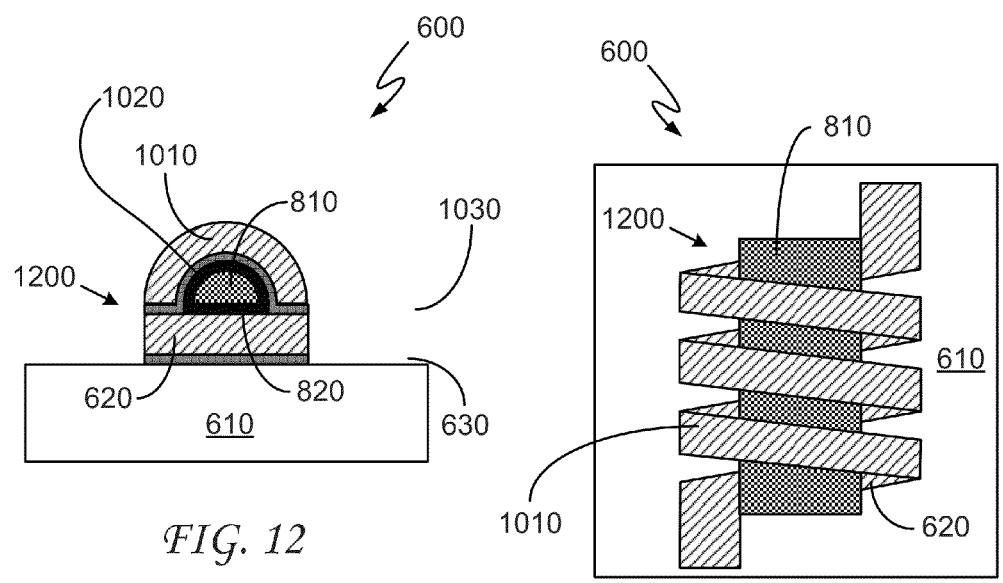
FIG. 12
FIG. 13

METHOD OF MANUFACTURING AN INDUCTOR FOR A MICROELECTRONIC DEVICE

CLAIM OF PRIORITY

This application is a divisional of U.S. patent application Ser. No. 12/157,803, now abandoned, which was filed on Jun. 11, 2008.

FIELD OF THE INVENTION

The disclosed embodiments of the invention relate generally to passive components used in power management for microelectronic devices, and relate more particularly to inductors used for such power management.

BACKGROUND OF THE INVENTION

Computer microprocessors are increasingly characterized by the existence of multiple silicon dies within a single package. This design makes possible certain performance gains, space savings, and other advantages. Yet multi-core architectures require strict power management in order to achieve good performance per watt. Currently, voltage regulator elements are typically placed on the mother board and a series of decoupling capacitors supply the power until the voltage regulator is able to respond, but this approach is already seen as being unable to provide appropriate power management in future processor technology generations. Some strategies to enable fine-grain power management and to decrease mother board- and package-associated parasitics involve placing the voltage regulator closer to the load, such as by integrating the voltage regulator into the substrate. An important step toward integrated voltage regulators is the construction of high-inductance, small-footprint inductors.

BRIEF DESCRIPTION OF THE DRAWINGS

The disclosed embodiments will be better understood from a reading of the following detailed description, taken in conjunction with the accompanying figures in the drawings in which:

FIGS. 6 and 7 are cross-sectional and top views, respectively, of a structure at a particular point in its manufacturing process according to an embodiment of the invention;

FIGS. 8 and 9 are cross-sectional and top views, respectively, of the structure first shown in FIG. 6 at a different particular point in its manufacturing process according to an embodiment of the invention;

FIGS. 10 and 11 are cross-sectional and top views, respectively, of the structure first shown in FIG. 6 at a different particular point in its manufacturing process according to an embodiment of the invention;

FIGS. 12 and 13 are cross-sectional and top views, respectively, of the structure first shown in FIG. 6 at a different particular point in its manufacturing process according to an embodiment of the invention;

Figure 1:
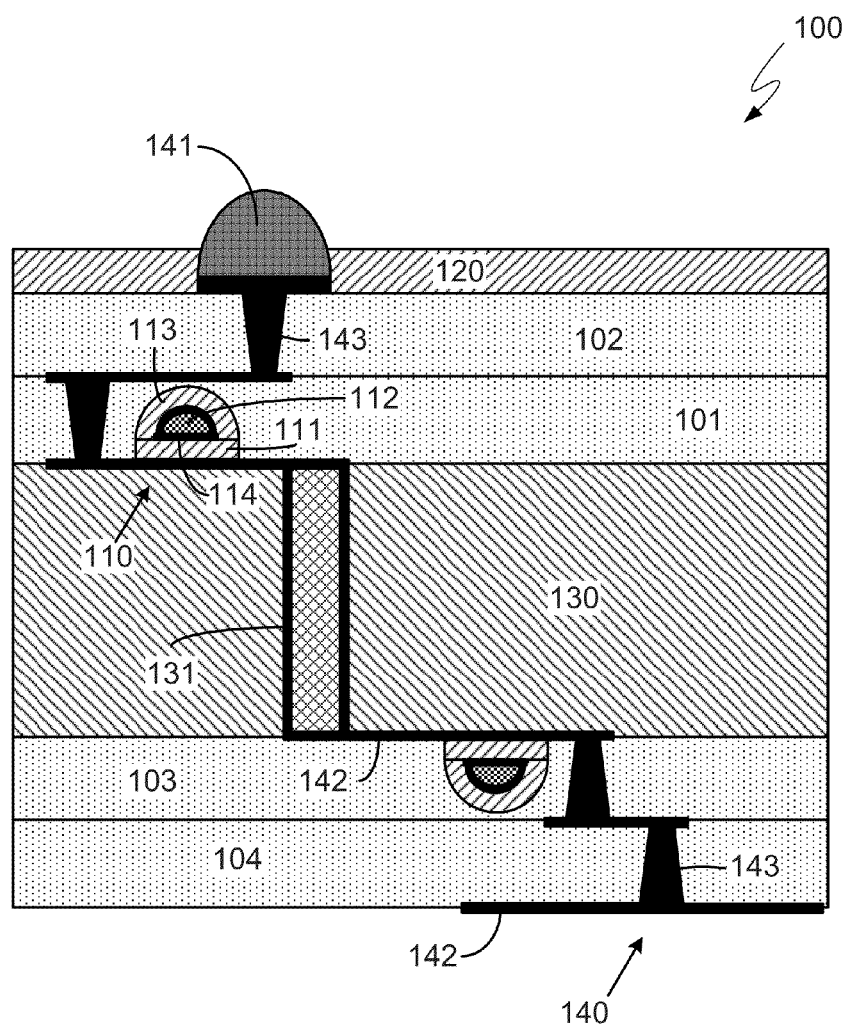
FIG. 1 is a cross-sectional view of a substrate for a microelectronic device according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a method of manufacturing an inductor for a microelectronic device comprises providing a substrate, forming a first plurality of inductor windings over the substrate, forming a magnetic inductor core over the first plurality of inductor windings, and forming a second plurality of inductor windings over the magnetic inductor core. In another embodiment, the method comprises forming the inductor on a sacrificial substrate such that the inductor can subsequently be mounted onto a carrier tape. In yet another embodiment, a method of manufacturing a substrate for a microelectronic device comprises forming an inductor within a build-up layer of the substrate.

Accordingly, embodiments of the invention permit the integration of high density inductors onto a package substrate, a capability that does not currently exist. Additionally, embodiments of the invention enable the formation of inductors having high inductances and high quality factors with small footprints, for example by the integration of a magnetic core, and provide a process flow for such formation in a high volume manufacturing environment. As suggested above, embodiments of the invention allow for both embedded and discrete inductor manufacturing.

Referring now to the drawings, FIG. 1 is a cross-sectional view of a package substrate 100 for a microelectronic device according to an embodiment of the invention. As illustrated in FIG. 1, package substrate 100 comprises a build-up layer 101, a plurality of inductor windings 111 in build-up layer 101, a magnetic inductor core 112 over plurality of inductor windings 111, a plurality of inductor windings 113 over magnetic inductor core 112, and a top layer 120 over build-up layer 101. Package substrate 100 further comprises an electrically insulating layer 114 between magnetic inductor core 112 and inductor windings 111 and 113. Inductor windings 111, magnetic inductor core 112, inductor windings 113, and electrically insulating layer 114, taken together, form an inductor 110 embedded in package substrate 100 (within build-up layer 101).

In the illustrated embodiment, package substrate 100 further comprises a core 130 containing a plated through hole (PTH) 131, an additional die-side build-up layer 102 (build-up layer 101 is also a die-side build-up layer), socket-side build-up layers 103 and 104, and an electrically conductive pathway 140 that includes a solder bump 141, conductive traces 142, and vias 143. (Only some of the conductive traces and vias are labeled with reference numerals in FIG. 1.) Notwithstanding the presence of a core in the illustrated package substrate, it should be understood that alternative (non-illustrated) package substrates according to other embodiments of the invention may have no core, and that embodiments of the invention encompass all packaging substrates of whatever kind.

It should be noted that inductor 110 could alternatively be located within any of build-up layers 102, 103, and 104, rather than in build-up layer 101 where it is depicted in FIG. 1, or within any of additional, non-illustrated, build-up layers that may exist in package substrate 100 or other substrates according to embodiments of the invention. Furthermore, one or more other inductors in addition to inductor 110 may also be embedded in package substrate 100, and these may be located in any of the illustrated or non-illustrated build-up layers. Build-up layer 103 in FIG. 1 depicts one such additional inductor (not labeled with a reference numeral).

As an example, build-up layer 101 can comprise a dielectric material—possibly a low-k dielectric material such as silicon dioxide doped with fluorine or carbon, porous silicon dioxide, or the like. Organic dielectric materials such as polymer-based epoxies and the like are also possibilities for build-up layer 101, and are perhaps more typical of current technologies. As used herein, references to a "low-k dielectric material" (or a material described using similar terminology) are references to a material having a dielectric constant that is no greater than approximately 3.5 (the dielectric constant of unaltered silicon dioxide is approximately 4.0-4.2) and in some cases as low as 2.0 or even lower. It should be understood, however, that (as alluded to above) build-up layer 101 need not necessarily be a low-k material but need only be an electrical insulating material, of whatever kind As another example, the additional build-up layers of package substrate 100, including build-up layers 102, 103, and 104, can be similar to build-up layer 101.

As another example, inductor windings 111 and 113 can comprise electrically conductive lines made of copper or the like, while top layer 120 can comprise a surface resist layer or the like. As yet another example, magnetic inductor core 112 can comprise a magnetic material such as iron or the like, or it can comprise a nano-composite ink containing a plurality of magnetic particles such as iron (Fe), cobalt (Co), Co—Co oxide, ferrites of various kinds, or the like. In one embodiment, each one of the magnetic particles has a largest dimension of less than approximately 1 micron.

Figure 2:
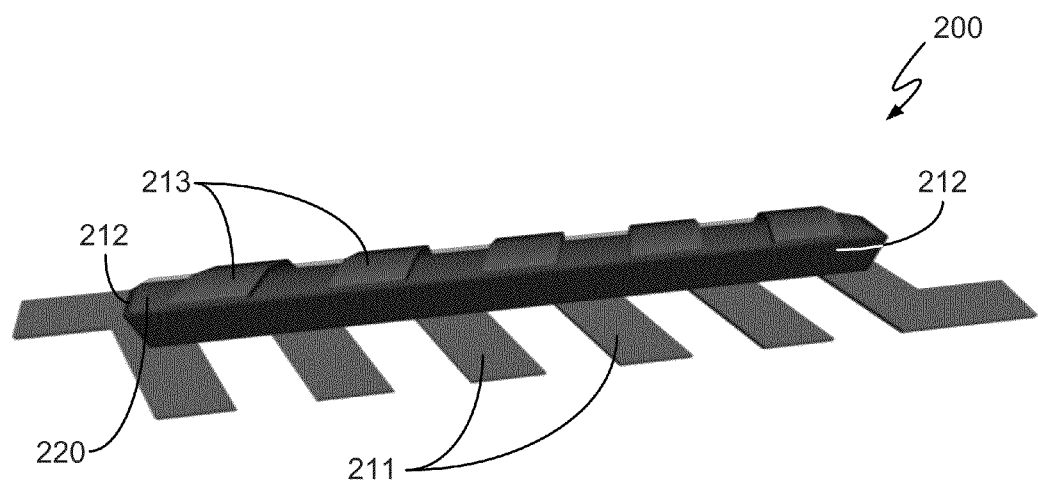
FIGS. 2 and 3 are cutaway perspective and perspective views, respectively, of an inductor according to an embodiment of the invention.
Figure 3:
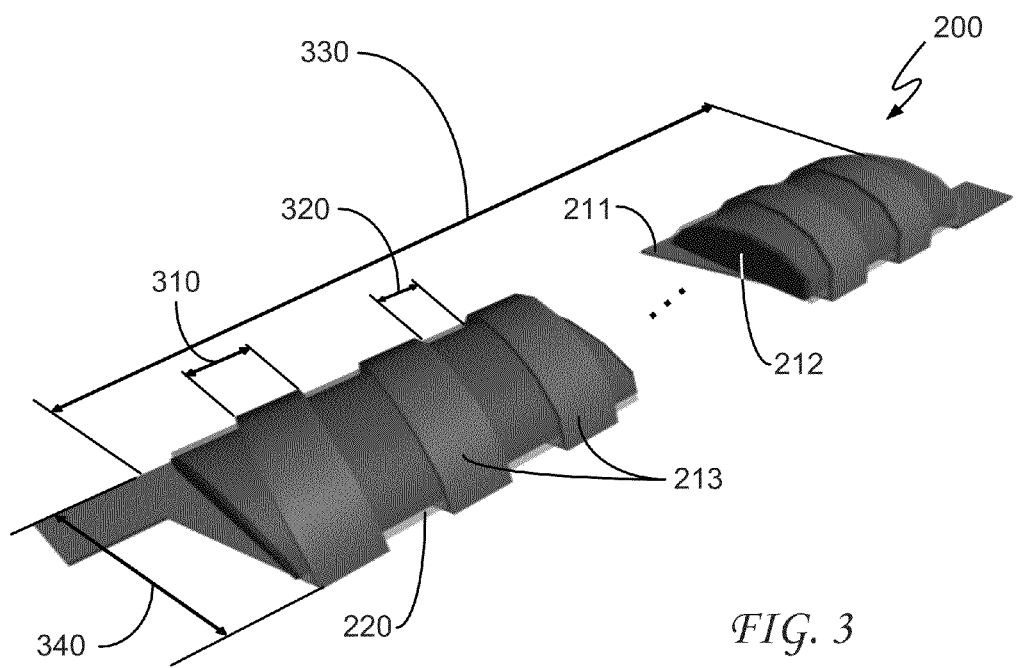

FIG. 2 is a cutaway perspective view of an inductor 200 and FIG. 3 is a perspective view of inductor 200 according to an embodiment of the invention. As an example, inductor 200 can be similar to inductor 110 that is shown in FIG. 1. As illustrated in FIG. 2, inductor 200 comprises lower inductor windings 211, a magnetic inductor core 212, and upper inductor windings 213. As an example, lower inductor windings 211, magnetic inductor core 212, and upper inductor windings 213 can be similar to, respectively, plurality of inductor windings 111, magnetic inductor core 112, and plurality of inductor windings 113, all of which are shown in FIG. 1.

It should be noted that lower inductor windings 211 and upper inductor windings 213 are connected to each other such that they form a continuous inductor coil around magnetic inductor core 212. Contiguous pairs of inductor windings—one lower inductor winding paired with one upper inductor winding—will be referred to herein as a "winding turn." The continuous inductor coil mentioned above may thus be thought of as being made up one or more winding turns. One reason the upper and lower inductor windings are referred to separately, with individual reference numerals, is that they may be formed and handled separately, as will be further described below.

In the illustrated embodiment, inductor 200 further comprises an electrically insulating layer 220 located between magnetic inductor core 212 and the inductor coil. (As suggested above, the (unlabeled) inductor coil is made up of all or at least substantially all of the winding turns, i.e., all of the upper and lower inductor windings.) In one embodiment, electrically insulating layer 220 comprises a first electrically insulating material (not labeled with a separate reference numeral in FIG. 2) between lower inductor windings 211 and magnetic inductor core 212 and a second electrically insulating material (also not labeled with a separate reference numeral in FIG. 2) between magnetic inductor core 212 and upper inductor windings 213. Electrically insulating layer 220 is necessary only when magnetic inductor core 212 is made of an electrically conductive magnetic material, such as permalloy or other plateable magnetic alloys containing Fe, nickel (Ni), or Co as the main magnetic element (as opposed to an electrically insulating magnetic material such as doped iron oxides and the like), and may thus be omitted from embodiments having no electrically conductive magnetic inductor core. As an example, electrically insulating layer 220 can be a photoresist that can be spun, sprayed, printed, or laminated on the surface of magnetic inductor core 212. As another example, electrically insulating layer 220 could be an inorganic dielectric material such as silicon dioxide ($SiO_2$). (In the latter example, the inorganic dielectric may require additional patterning for selective removal.) As another example, the first electrically insulating material and second electrically insulating material may each have a thickness no greater than approximately 10 microns. It should be noted here that electrically insulating layer 114 (see FIG. 1) can be similar to electrically insulating layer 220.

In one embodiment, magnetic inductor core 212 has a width between approximately 5 micrometers (hereinafter "microns" or μm) and approximately 140 microns, a height between approximately 2 microns and approximately 140 microns, and a diameter or other thickness as great as approximately 20 microns. In the same or another embodiment, and referring to FIG. 3, each inductor winding has a width 310 of between approximately 5 microns and approximately 50 microns, with gaps between windings having a width 320 of between approximately 5 microns and approximately 50 microns. It should be noted that at least in certain embodiments it is desirable to make width 320 as small as possible—e.g., as small as the lithography process will allow—because doing so increases the inductance per unit length of inductor 200 and also decreases losses for a given frequency range.

In the same or another embodiment, inductor 200 can comprise between approximately 3 and approximately 30 windings for a total length 330 (in the given embodiment) of between approximately 40 microns and approximately 3200 microns. The number of windings may depend on, among other things, the required inductance of a particular voltage regulator design, the space available, and the maximum resistance that can be allowed. A width 340 of inductor 200 may be between approximately 10 microns and approximately 150 microns. The proposed variations of the trace line thicknesses, widths, spacing, and other parameters may allow the resistance value of the coil to be adjusted in order to achieve the range needed for a variety of applications.

FIGS. 2 and 3 illustrate examples of what are referred to herein as "open-loop" inductors: inductors having an open-ended magnetic inductor core. A solenoid-type inductor is an example of an open-loop inductor. Also contemplated according to various embodiments of the invention are what are referred to herein as "closed-loop" inductors: inductors having a magnetic inductor core that closes back on itself to form a continuous ring, loop, or other closed path. One example of a closed-loop inductor is a toroid inductor such as that shown in perspective view according to an embodiment of the invention in FIG. 4.

Figure 4:
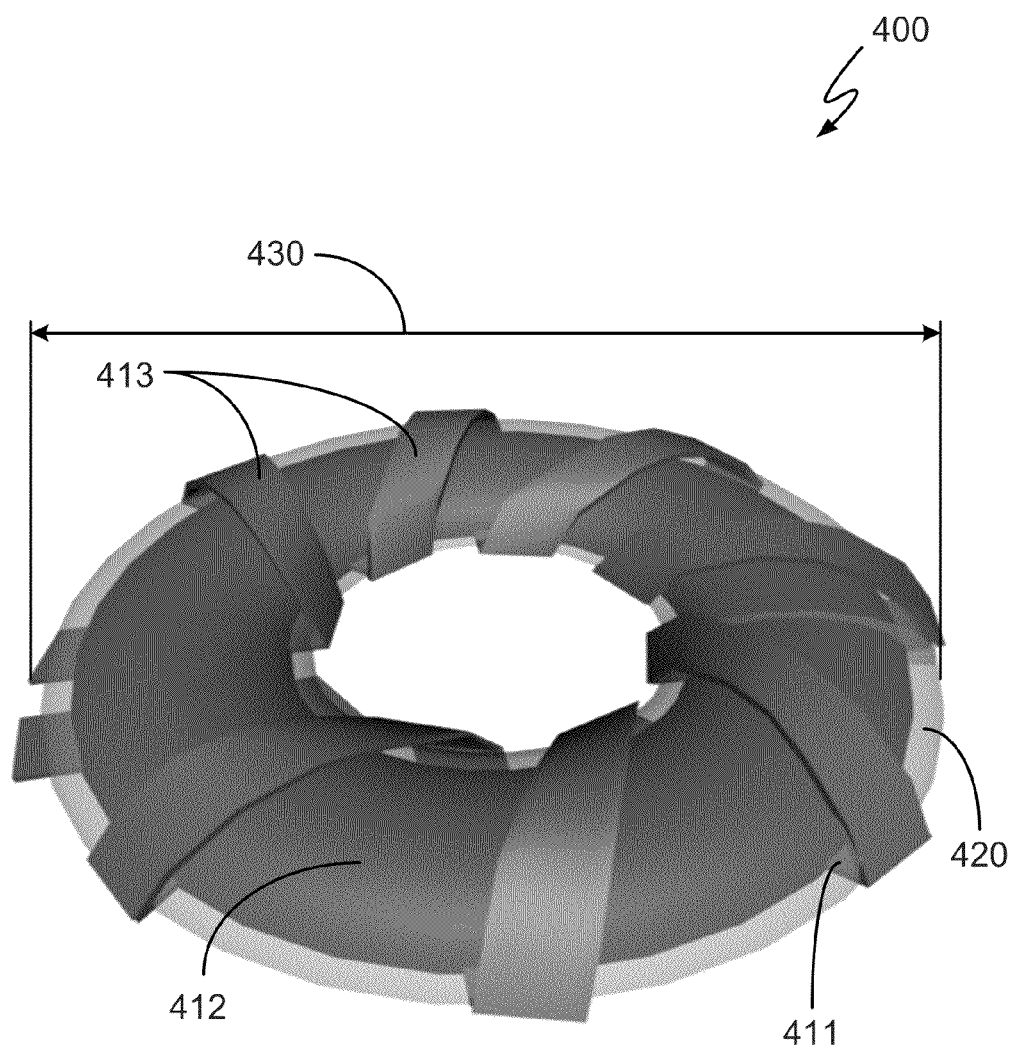
FIG. 4 is a perspective view of an inductor according to a different embodiment of the invention.

As illustrated in FIG. 4, an inductor 400 comprises lower inductor windings 411, a magnetic inductor core 412, upper inductor windings 413, and an electrically insulating layer 420 located between magnetic inductor core 412 and lower and upper inductor windings 411 and 413 (i.e., the inductor coil). As an example, inductor 400 can be similar to inductor 110 that is shown in FIG. 1. As another example, lower inductor windings 411, magnetic inductor core 412, and upper inductor windings 413 can be similar to, respectively, plurality of inductor windings 111, magnetic inductor core 112, and plurality of inductor windings 113, all of which are shown in FIG. 1. As another example, electrically insulating layer 420 can be similar to electrically insulating layer 220 that is first shown in FIG. 2.

As illustrated, magnetic inductor core 412 of inductor 400 is a closed-loop magnetic inductor core having a substantially circular (toroidal) shape with a diameter 430 of between approximately 30 microns and approximately 900 microns. It should be noted that a toroid shape gives a higher inductance than a solenoid shape for the same number of windings.

Figure 5:
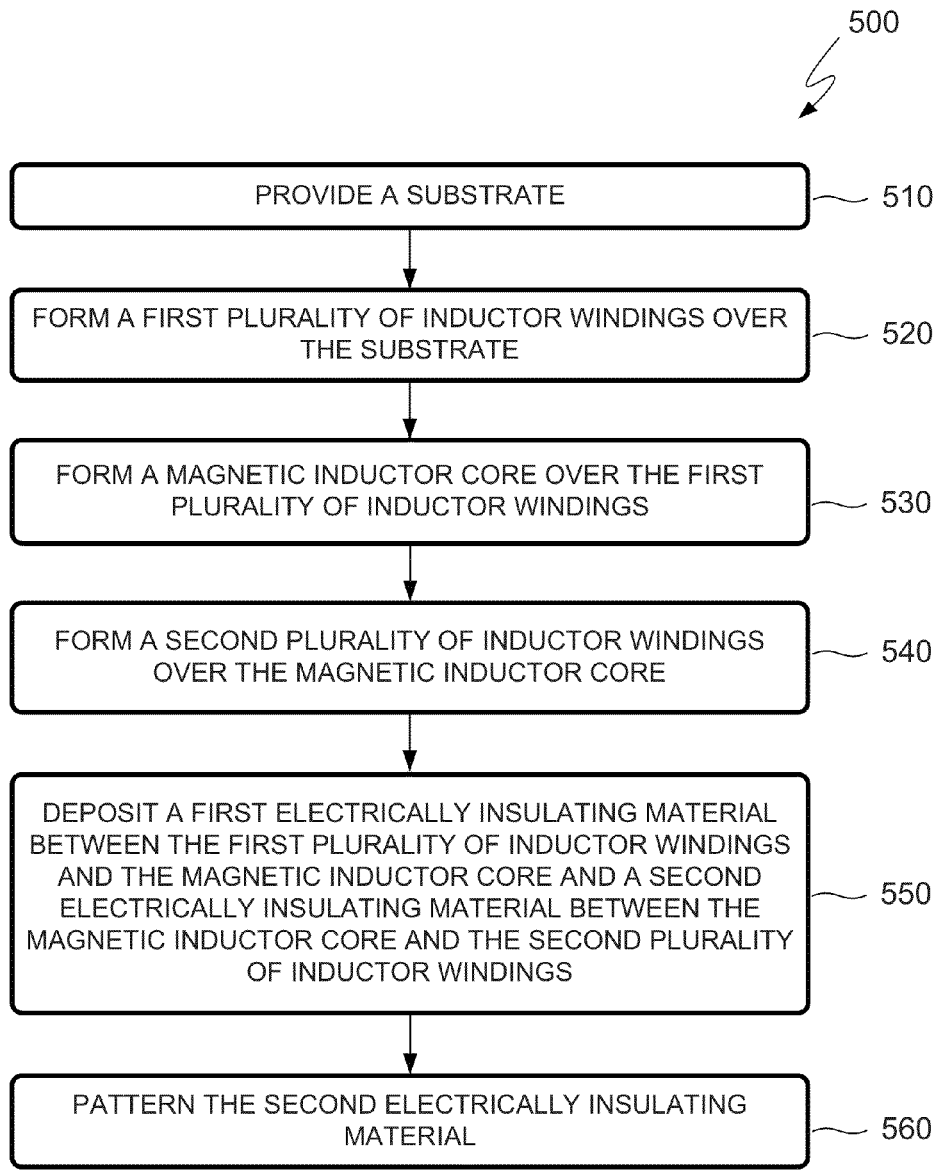
FIG. 5 is a flowchart illustrating a method of manufacturing an inductor for a microelectronic device according to an embodiment of the invention.

FIG. 5 is a flowchart illustrating a method 500 of manufacturing an inductor for a microelectronic device according to an embodiment of the invention. A step 510 of method 500 is to provide a substrate. This substrate can be anything that may serve as a bottom or foundation layer for the inductor, including, for example, a core, a build-up layer (either die-side and socket side), or a top surface of a finished package substrate, or the like. It may be seen that with the former two of the listed options the inductor would be an embedded inductor, while with the latter listed option it would be a surface-mounted inductor. As an example, the substrate can be similar to build-up layer 101 that is shown in FIG. 1. As another example, the substrate can be similar to a substrate 610 first shown in FIG. 6, which is a cross-sectional view of a structure 600 at a particular point in its manufacturing process according to an embodiment of the invention.

A step 520 of method 500 is to form a first plurality of inductor windings over the substrate. As an example, the first plurality of inductor windings can be similar to inductor windings 111 that are shown in FIG. 1. As another example, the first plurality of inductor windings can be similar to inductor windings 620 that are shown in FIG. 6. Inductor windings 620 are also illustrated in FIG. 7, which is a top view of structure 600 according to an embodiment of the invention.

In one embodiment, step 520 comprises depositing a metallic seed layer on the substrate, patterning the metallic seed layer in order to define a plating region on the metallic seed layer, and plating an electrically conductive material onto the metallic seed layer such that the electrically conductive material is located only in the plating region. As an example, the metallic seed layer could be made of, among other things, copper, titanium-copper, tungsten, titanium, tungsten-copper, or the like. Tungsten and titanium, for example, adhere well to many surfaces. As another example, the metallic seed layer can be similar to a metallic seed layer 630 that is first shown in FIG. 6. As another example, the metallic seed layer can be patterned, and the plating region defined, using a photoresist 640 that is also first shown in FIG. 6.

A step 530 of method 500 is to form a magnetic inductor core over the first plurality of inductor windings. As an example, the magnetic inductor core can be similar to magnetic inductor core 112 that is shown in FIG. 1. As another example, the magnetic inductor core can be similar to a magnetic inductor core 810 that is first shown in FIG. 8, which is a cross-sectional view of structure 600 at a different point in its manufacturing process according to an embodiment of the invention. Magnetic inductor core 810 is also illustrated in FIG. 9, which is a top view of structure 600 according to an embodiment of the invention at the same point in the manufacturing process of structure 600 that is depicted in FIG. 8.

In one embodiment, step 530 comprises depositing a magnetic material, patterning the magnetic material in order to define a core region, and shaping the magnetic material such that it is confined to the core region. As an example, the magnetic material may be deposited by sputtering, chemical vapor deposition (CVD), evaporation, radio frequency (RF)-sputtering, atomic layer deposition (ALD), soft chemistry methods such as sol-gel, chemical reduction, and oxide coprecipitation, or the like. In one embodiment, patterning the magnetic material comprises depositing a photoresist mask on the magnetic material and thermally treating the photoresist mask such that the photoresist mask assumes a rounded shape. In another embodiment, patterning the magnetic material comprises depositing a photoresist mask on the magnetic material using an ink-jet spraying procedure to deposit the photoresist mask with a rounded shape. In either embodiment, or in other embodiments, shaping the magnetic material can comprise conformally etching the magnetic material such that the magnetic material also assumes a rounded shape. As an example, this rounded shape can exist at both hemispheres of the magnetic inductor core, such that the magnetic inductor core assumes a cylindrical shape, at only a single hemisphere, such that the magnetic inductor core assumes a semi-circular cross section, or at some other portion of the magnetic inductor core.

In another embodiment, step 530 comprises using an ink-jet spraying procedure to deposit a nano-composite ink over the first plurality of inductor windings and transforming the nano-composite ink into a magnetic material having a rounded shape. The "transforming" step might include the drying/solidification of nano-composite into a continuous magnetic film and also any tempering/sintering steps necessary for the formation of a ceramic magnetic material. Compared to the embodiment described in the previous paragraph, in which the magnetic inductor core is formed with depositing, patterning, and shaping steps, this latter embodiment tends to be simpler (e.g., does not require vacuum equipment or subsequent patterning steps) and more cost efficient, but tends to produce a slightly lower-quality (lower density) core.

A step 540 of method 500 is to form a second plurality of inductor windings over the magnetic inductor core. As an example, the second plurality of inductor windings can be similar to inductor windings 113 that are shown in FIG. 1. As another example, the second plurality of inductor windings can be similar to inductor windings 1010 that are first shown in FIG. 10, which is a cross-sectional view of structure 600 at a different point in its manufacturing process according to an embodiment of the invention. Inductor windings 1010 are also illustrated in FIG. 11, which is a top view of structure 600 according to an embodiment of the invention at the same point in the manufacturing process of structure 600 that is depicted in FIG. 10.

In one embodiment, step 540 comprises forming a metallic seed layer, patterning the metallic seed layer in order to define a plating region on the metallic seed layer, and plating an electrically conductive material onto the metallic seed layer such that the electrically conductive material is located only in the plating region. As an example, the metallic seed layer could be made of, among other things, copper, titanium-copper, tungsten, titanium, tungsten-copper, or the like. As another example, the metallic seed layer can be similar to a metallic seed layer 1030 that is first shown in FIG. 10. As another example, the metallic seed layer can be patterned, and the plating region defined, using a photoresist 1040 that is also first shown in FIG. 10.

In certain embodiments, such as where the magnetic inductor core is electrically conductive, method 500 further comprises a step 550, which is to deposit a first electrically insulating material between the first plurality of inductor windings and the magnetic inductor core and a second electrically insulating material between the magnetic inductor core and the second plurality of inductor windings. As an example, the first electrically insulating material and the second electrically insulating material can each be similar to the electrically insulating materials making up electrically insulating layer 220. As another example, the first electrically insulating material can be similar to an electrically insulating layer 820 that is first shown in FIG. 8 and the second electrically insulating material can be similar to an electrically insulating layer 1020 that is first shown in FIG. 10. In various embodiments, step 550 comprises spinning, spraying, printing, laminating, or otherwise applying a photo-resist over the first plurality of inductor windings or over the magnetic inductor core, as appropriate. In other embodiments, step 550 comprises depositing an inorganic dielectric material such as $SiO_2$ or the like. These latter embodiments may require additional patterning steps for selective removal of the dielectric material.

In certain embodiments, including those in which the magnetic inductor core has a rounded shape as described above, method 500 may further comprise a step 560, which is to pattern the second electrically insulating material. As an example, such patterning of the second electrically insulating material may be performed in order to cause the second electrically insulating material to curve over the rounded shape of the magnetic inductor core, as shown in FIG. 10. The first electrically insulating material, in contrast, and as also shown in FIG. 10 (as well as other figures), need not necessarily be rounded or otherwise patterned, seeing that it may be, at least in some embodiments such as the semi-circular cross section embodiment mentioned above, located adjacent to a flat side of the magnetic inductor core.

Further processing of structure 600 may include the removal of photoresist 1040, metallic seed layer 1030 (except for those portions underlying inductor windings 1010), photoresist 640, and metallic seed layer 630 (except for those portions underlying inductor windings 620). The result is a finished inductor 1200 according to an embodiment of the invention that is shown in cross section in FIG. 12 and in plan view in FIG. 13.

Figure 14:
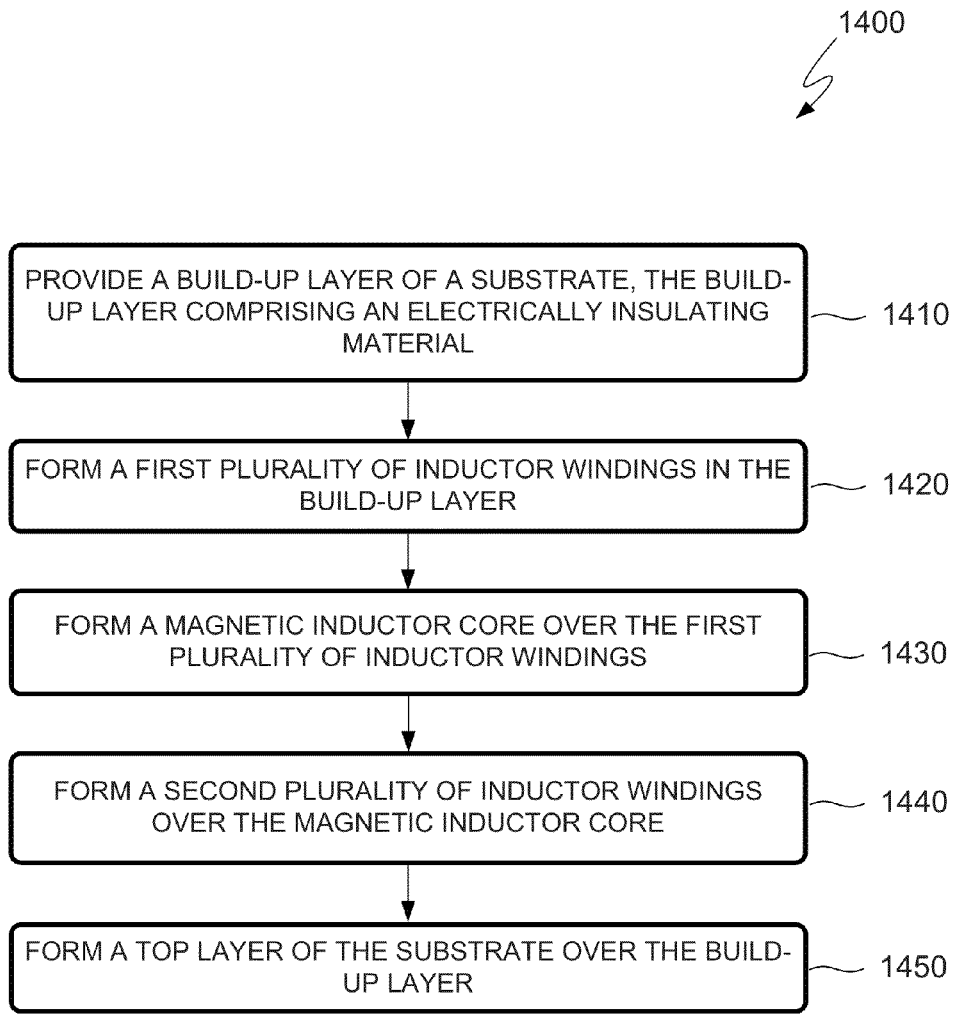
FIG. 14 is a flowchart illustrating a method of manufacturing a substrate for a microelectronic device according to an embodiment of the invention.

FIG. 14 is a flowchart illustrating a method 1400 of manufacturing a substrate for a microelectronic device according to an embodiment of the invention. Method 1400 results in an inductor that is embedded within a build-up layer of a substrate, such as the inductor illustrated in FIG. 1. A characteristic of this method is that the substrates will have the inductors already placed in them and there would be no need for additional assembly process steps: the inductor manufacturing process steps will be embedded into the manufacture of the substrate build up layers. In various embodiments, the lowest-level and next-lowest-level build-up layers (i.e., the 1F and 2F layers) are particular well suited as the location for such embedded inductors, but depending on factors such as layer count and substrate type the inductor can be embedded into or in-between any of the buildup layers.

A step 1410 of method 1400 is to provide a build-up layer of the substrate, the build-up layer comprising an electrically insulating material. As an example, the build-up layer can be similar to build-up layer 101 that is shown in FIG. 1, which is a first-level die-side build-up layer of the substrate. As another example, the build-up layer can be a second-level or other die-side build-up layer of the substrate or it can be a socket-side build-up layer of the substrate. As another example, the electrically insulating material can be similar to the electrically insulating material making up electrically insulating layer 220 that is first shown in FIG. 2.

A step 1420 of method 1400 is to form a first plurality of inductor windings in the build-up layer. As an example, the first plurality of inductor windings can be similar to inductor windings 111 that are shown in FIG. 1. In one embodiment, step 1420 comprises forming a first metallic seed layer in the build-up layer, patterning the first metallic seed layer in order to define a first plating region on the first metallic seed layer, and plating a first electrically conductive material onto the first metallic seed layer such that the first electrically conductive material is located only in the first plating region. As an example, the metallic seed layer could be made of, among other things, copper, titanium-copper, tungsten, titanium, tungsten-copper, or the like.

A step 1430 of method 1400 is to form a magnetic inductor core over the first plurality of inductor windings. As an example, the magnetic inductor core can be similar to magnetic inductor core 112 that is shown in FIG. 1.

In one embodiment, step 1430 comprises depositing a magnetic material, patterning the magnetic material in order to define a core region, and shaping the magnetic material such that it is confined to the core region. As an example, the magnetic material may be deposited by sputtering, chemical vapor deposition (CVD), evaporation, RF-sputtering, atomic layer deposition (ALD), soft chemistry methods, and the like. In one embodiment, patterning the magnetic material comprises process steps as described above in connection with step 530 of method 500, with resulting structure as also described in connection with method 500.

In another embodiment, step 1430 comprises using an ink-jet spraying procedure to deposit a nano-composite ink over the first plurality of inductor windings and transforming the nano-composite ink into a magnetic material having a rounded shape. The "transforming" step might include the drying/solidification of nano-composite into a continuous magnetic film and also any tempering/sintering steps necessary for the formation of a ceramic magnetic material.

A step 1440 of method 1400 is to form a second plurality of inductor windings over the magnetic inductor core. As an example, the second plurality of inductor windings can be similar to inductor windings 113 that are shown in FIG. 1. In one embodiment, step 1440 comprises forming a second metallic seed layer in the build-up layer over the first metallic seed layer, patterning the second metallic seed layer in order to define a second plating region on the second metallic seed layer, and plating a second electrically conductive material onto the second metallic seed layer such that the second electrically conductive material is located only in the second plating region.

A step 1450 of method 1400 is to form a top layer of the substrate over the build-up layer. As an example, the top layer can be similar to top layer 120 that is shown in FIG. 1.

Figure 15:
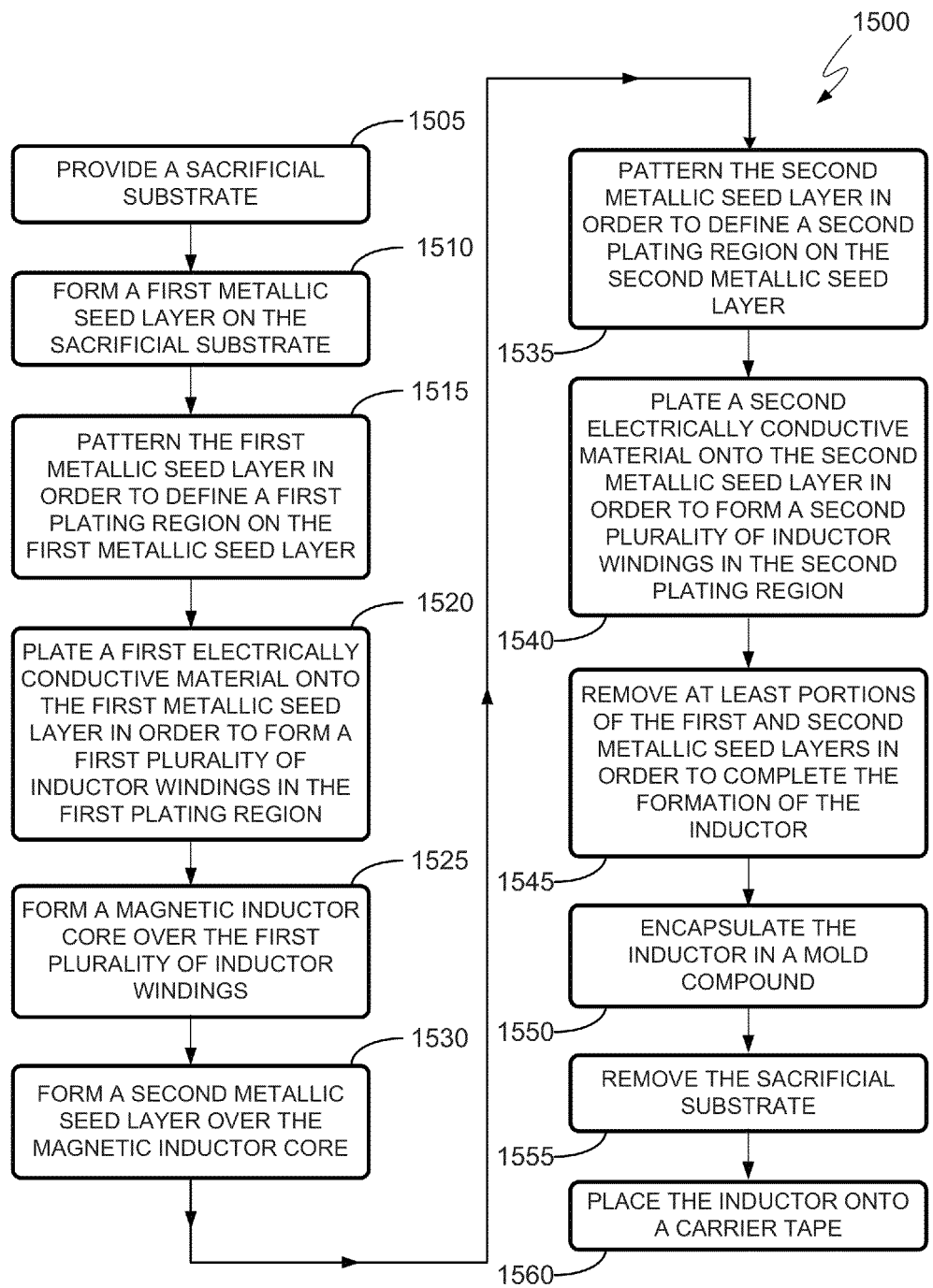
FIG. 15 is a flowchart illustrating a method of manufacturing an inductor for a microelectronic device according to an embodiment of the invention.
Figure 16:
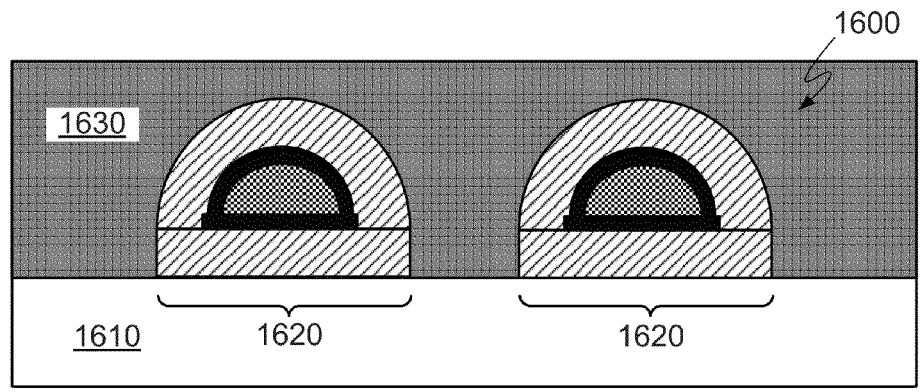
FIG. 16 is a cross-sectional view of a structure according to an embodiment of the invention at a particular point in a manufacturing process.

FIG. 15 is a flowchart illustrating a method 1500 of manufacturing an inductor for a microelectronic device according to an embodiment of the invention. Method 1500 results in an inductor manufactured separately from a substrate (or other final destination) such that the inductor may subsequently be placed at its final destination. A characteristic of method 1500 is that it would require no changes to existing substrate assembly process flows and thus no added cost in the substrate manufacturing process. Furthermore, the packaging substrate itself would not be exposed to the inductor manufacturing process flow, thus allowing rework due to faulty inductors to take place. Method 1500 will be discussed in more detail in the paragraphs below, with references to FIG. 16, which is a cross-sectional view of a structure 1600 according to an embodiment of the invention at a particular point in a manufacturing process. As illustrated in FIG. 16, structure 1600 comprises a sacrificial substrate 1610, inductors 1620 on sacrificial substrate 1610, and a mold compound 1630 encapsulating inductors 1620.

A step 1505 of method 1500 is to provide a sacrificial substrate. As an example, the sacrificial substrate could take the form of a panel or a strip or the like. Referring to FIG. 16, the sacrificial substrate can be similar to sacrificial substrate 1610.

A step 1510 of method 1500 is to form a first metallic seed layer on the sacrificial substrate. As an example, the metallic seed layer could be made of, among other things, copper, titanium-copper, tungsten, titanium, tungsten-copper, or the like.

A step 1515 of method 1500 is to pattern the first metallic seed layer in order to define a first plating region on the first metallic seed layer.

A step 1520 of method 1500 is to plate a first electrically conductive material onto the first metallic seed layer in order to form a first plurality of inductor windings in the first plating region. As an example, the first plurality of inductor windings can be the lower inductor windings of inductors 1620.

A step 1525 of method 1500 is to form a magnetic inductor core over the first plurality of inductor windings. As an example, the magnetic inductor core can be the magnetic inductor core of one of inductors 1620. As another example, the magnetic inductor core can be similar to magnetic inductor core 112 that is shown in FIG. 1. In various embodiments, step 1525 comprises process steps that are similar to or the same as those described above in connection with step 530 of method 500, with resulting structure as also described in connection with method 500.

A step 1530 of method 1500 is to form a second metallic seed layer over the magnetic inductor core. As an example, the metallic seed layer could be made of, among other things, copper, titanium-copper, tungsten, titanium, tungsten-copper, or the like.

A step 1535 of method 1500 is to pattern the second metallic seed layer in order to define a second plating region on the second metallic seed layer.

A step 1540 of method 1500 is to plate a second electrically conductive material onto the second metallic seed layer in order to form a second plurality of inductor windings in the second plating region. As an example, the second plurality of inductor windings can be the upper inductor windings of inductors 1620.

A step 1545 of method 1500 is to remove at least portions of the first and second metallic seed layers in order to complete the formation of the inductor. As an example, the portions of the first and second metallic seed layers that are removed can be those portions that are not located underneath the first and second pluralities of inductor windings.

Figure 17:
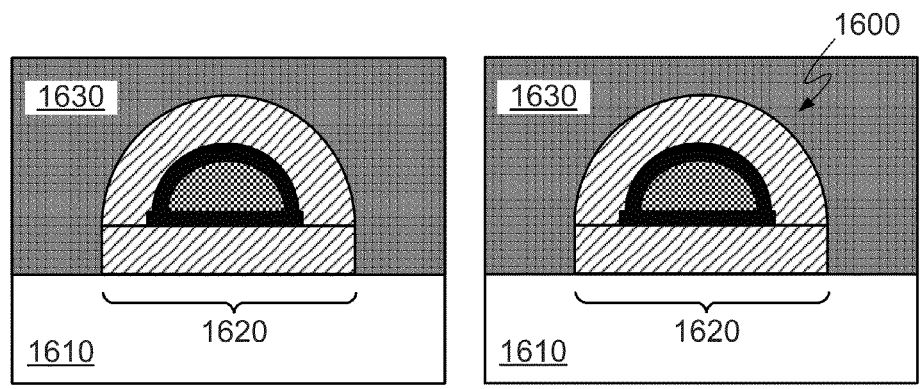
FIG. 17, which is a cross-sectional view of the structure of FIG. 16 according to an embodiment of the invention at a different point in the manufacturing process.

A step 1550 of method 1500 is to encapsulate the inductor in a mold compound. As an example, the mold compound can be similar to mold compound 1630 that is shown in FIG. 16. In one embodiment, step 1550 or another step comprises singulating the inductors on the sacrificial substrate in order to create individual encapsulated inductors, as illustrated in FIG. 17, which is a cross-sectional view of structure 1600 according to an embodiment of the invention at a different point in the manufacturing process.

A step 1555 of method 1500 is to separate the inductor from the sacrificial substrate. In one embodiment, step 1555 comprises etching back the first metallic seed layer, thus releasing the inductor. In another embodiment, step 1555 comprises etching, dissolving, or otherwise removing the sacrificial substrate itself.

Figure 18:
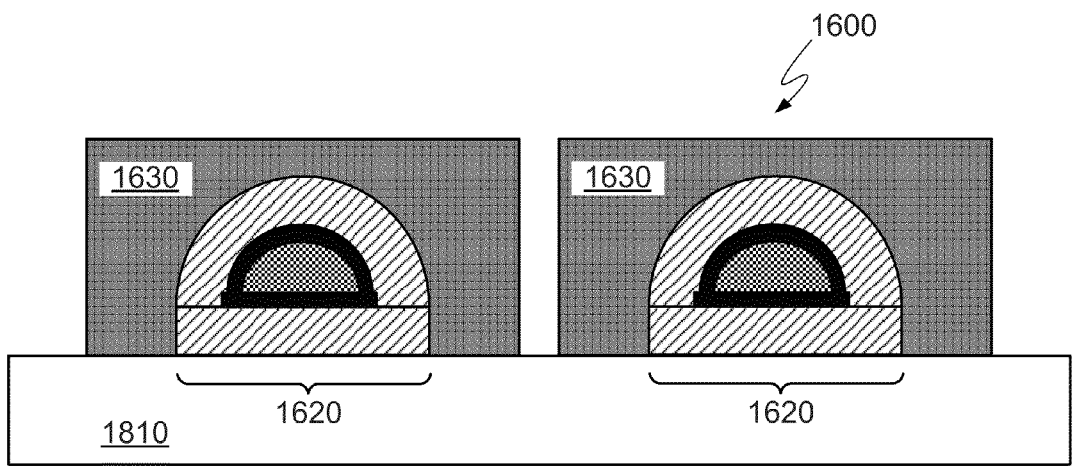
FIG. 18, which is a cross-sectional view of the structure of FIG. 16 according to an embodiment of the invention at a different point in the manufacturing process.

A step 1560 of method 1500 is to place the inductor onto a carrier tape. As an example, the carrier tape can be similar to a carrier tape 1810 that is shown in FIG. 18, which is a cross-sectional view of structure 1600 according to an embodiment of the invention at a different point in the manufacturing process. As another example, the inductors can be placed on the carrier tape using a pick and place process. The carrier tape may then be fed to an existing substrate assembly system and the inductors may be surface mounted on a packaging substrate such as the one shown in FIG. 19, described below.

Figure 19:
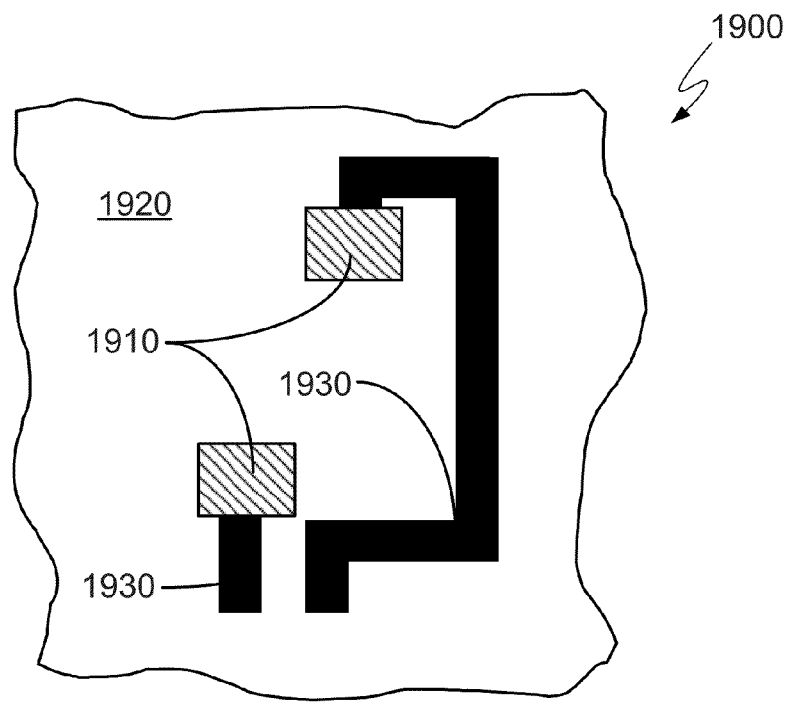
FIG. 19 is a plan view of a packaging substrate capable of receiving a surface-mounted inductor according to an embodiment of the invention.

FIG. 19 is a plan view of a packaging substrate 1900 capable of receiving a surface-mounted inductor according to an embodiment of the invention. As mentioned above, packaging substrate 1900 may receive inductors from a carrier tape such as carrier tape 1810 that is shown in FIG. 18. Alternatively, packaging substrate 1900 may act as a starting point for the manufacturing process described above as method 500. In other words, packaging substrate 1900 may in certain embodiments be the substrate that is provided in step 510 of method 500.

As illustrated in FIG. 19, packaging substrate 1900 comprises surface pads 1910 on a surface resist 1920 that resides on a die side of packaging substrate 1900. As an example, surface resist 1920 can be similar to top layer 120 that is shown in FIG. 1. Traces 1930 electrically connect the inductor (when it is mounted on surface pads 1910) to the rest of the circuitry within packaging substrate 1900. Traces 1930, which may be made of copper or the like, are embedded in or extend into the top substrate metal layer (below surface resist 1920). In the illustrated embodiment, traces 1930 have a pattern that is appropriate for a solenoid-type open-loop inductor. The inductor that is mounted on surface pads 1910 could alternatively be of the toroid-type (or another closed-loop inductor), in which case the metal pattern would differ somewhat from that shown in FIG. 19.

In certain embodiments a substrate may be manufactured with portions of the inductor already built into it, thus simplifying the manufacture of the inductor. As an example, the lower inductor windings may be manufactured with the substrate and methods 500 and 1400 may then begin, respectively, with steps 530 and 1430. A substrate of this kind is illustrated in FIG. 20.

Figure 20:
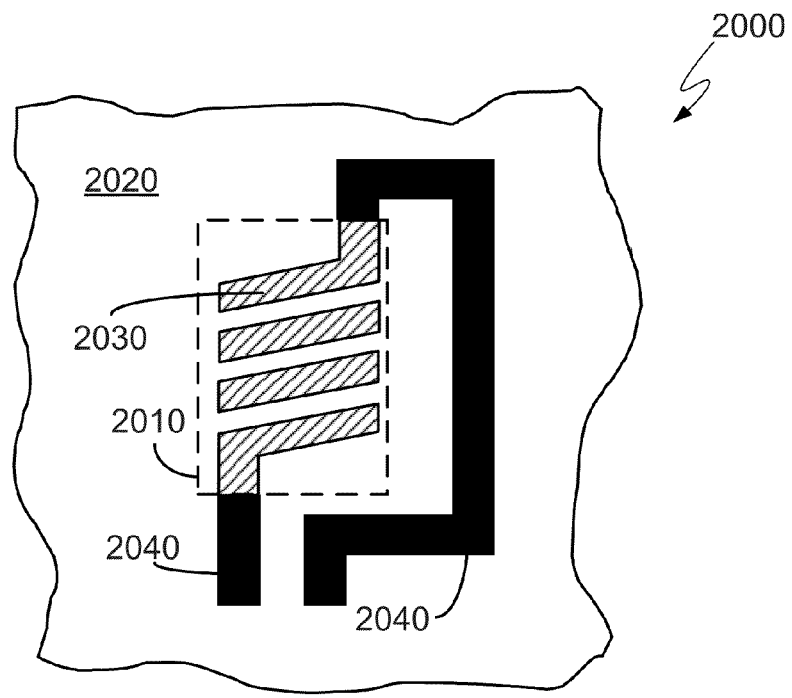
FIG. 20 is a plan view of a different packaging substrate according to an embodiment of the invention.

FIG. 20 is a plan view of a packaging substrate 2000 according to an embodiment of the invention having portions of an inductor built into it as described above. As illustrated in FIG. 20, packaging substrate 2000 comprises a surface resist opening 2010 in a surface resist 2020 that exposes lower inductor windings 2030 within a top metal layer of packaging substrate 2000. Lower inductor windings 2030 close the inductor loop when the inductor is mounted within surface resist opening 2010.

As an example, surface resist 2020 can be similar to top layer 120 that is shown in FIG. 1. Traces 2040 electrically connect the inductor (when it is mounted in surface resist opening 2010) to the rest of the circuitry within packaging substrate 2000. Traces 2040, which may be made of copper or the like, are embedded in or extend into the top substrate metal layer (below surface resist 2020). In the illustrated embodiment, traces 2040 have a pattern that is appropriate for a solenoid-type open-loop inductor. The inductor that is mounted in surface resist opening 2010 could alternatively be of the toroid-type (or another closed-loop inductor), in which case the metal pattern would differ somewhat from that shown in FIG. 20. In the illustrated embodiment, packaging substrate 2000 would require solder or another adhesive (not shown) printed onto the resist openings to allow for soldering (or otherwise adhering) the inductor to the packaging substrate.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the inductors and related methods and structures discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing an inductor for a microelectronic device, the method comprising:
   providing a substrate;
   forming a first plurality of inductor windings over the substrate;
   forming a magnetic inductor core over the first plurality of inductor windings; and
   forming a second plurality of inductor windings over the magnetic inductor core,
   wherein:
      forming the first plurality of inductor windings comprises:
         depositing a metallic seed layer on the substrate;
         patterning the metallic seed layer in order to define a plating region on the metallic seed layer; and
         plating an electrically conductive material onto the metallic seed layer such that the electrically conductive material is located only in the plating region.

2. The method of claim 1 wherein:
   forming the second plurality of inductor windings comprises:
      forming a metallic seed layer;
   patterning the metallic seed layer in order to define a plating region on the metallic seed layer; and
   plating an electrically conductive material onto the metallic seed layer such that the electrically conductive material is located only in the plating region.

3. A method of manufacturing an inductor for a microelectronic device, the method comprising:
   providing a substrate;
   forming a first plurality of inductor windings over the substrate;

forming a magnetic inductor core over the first plurality of inductor windings; and forming a second plurality of inductor windings over the magnetic inductor core, wherein:
   forming the second plurality of inductor windings comprises:
      forming a metallic seed layer;
      patterning the metallic seed layer in order to define a plating region on the metallic seed layer; and
      plating an electrically conductive material onto the metallic seed layer such that the electrically conductive material is located only in the plating region.

4. The method of claim 1 or 3 wherein:

forming the magnetic inductor core comprises:

depositing a magnetic material;

patterning the magnetic material in order to define a core region; and shaping the magnetic material such that it is confined to the core region.

5. The method of claim 4 wherein:

patterning the magnetic material comprises:
   depositing a photoresist mask on the magnetic material; and
   thermally treating the photoresist mask such that the photoresist mask assumes a rounded shape; and
shaping the magnetic material comprises:
   conformally etching the magnetic material such that the magnetic material also assumes a rounded shape.

6. The method of claim 4 wherein:

patterning the magnetic material comprises:
   depositing a photoresist mask on the magnetic material using an ink jet spraying procedure to deposit the photoresist mask with a rounded shape; and
shaping the magnetic material comprises:
   conformally etching the magnetic material such that the magnetic material also assumes a rounded shape.

7. The method of claim 1 or 3 further comprising:

depositing a first electrically insulating material between the first plurality of inductor windings and the magnetic inductor core; and depositing a second electrically insulating material between the magnetic inductor core and the second plurality of inductor windings.

8. The method of claim 7 further comprising:

patterning the second electrically insulating material.

9. A method of manufacturing an inductor for a microelectronic device, the method comprising:

providing a substrate;

forming a first plurality of inductor windings over the substrate;

forming a magnetic inductor core over the first plurality of inductor windings; and forming a second plurality of inductor windings over the magnetic inductor core, wherein:
   forming the magnetic inductor core comprises:
      depositing a magnetic material;
      patterning the magnetic material in order to define a core region; and
      shaping the magnetic material such that it is confined to the core region;
   patterning the magnetic material comprises:
      depositing a photoresist mask on the magnetic material; and
      thermally treating the photoresist mask such that the photoresist mask assumes a rounded shape; and
   shaping the magnetic material comprises:
      conformally etching the magnetic material such that the magnetic material also assumes a rounded shape.

10. A method of manufacturing an inductor for a microelectronic device, the method comprising:

providing a substrate;

forming a first plurality of inductor windings over the substrate;

forming a magnetic inductor core over the first plurality of inductor windings; and forming a second plurality of inductor windings over the magnetic inductor core, wherein:
   forming the magnetic inductor core comprises:
      depositing a magnetic material;
      patterning the magnetic material in order to define a core region; and
      shaping the magnetic material such that it is confined to the core region;
   patterning the magnetic material comprises:
      depositing a photoresist mask on the magnetic material using an ink jet spraying procedure to deposit the photoresist mask with a rounded shape; and
   shaping the magnetic material comprises:
      conformally etching the magnetic material such that the magnetic material also assumes a rounded shape.

* * * * *